United States Patent
Yeger et al.

(10) Patent No.: US 12,360,947 B2
(45) Date of Patent: Jul. 15, 2025

(54) METHOD FOR REDUCING PRIMARY AND BACKUP STORAGE

(71) Applicant: HUAWEI TECHNOLOGIES CO., LTD., Shenzhen (CN)

(72) Inventors: Asaf Yeger, Hod Hasharon (IL); Assaf Natanzon, Hod Hasharon (IL); Michael Gutman, Hod Hasharon (IL); Shmoolik Yosub, Hod Hasharon (IL); Shahar Salzman, Hod Hasharon (IL); David Segal, Hod Hasharon (IL); Idan Zach, Hod Hasharon (IL)

( * ) Notice: Subject to any disclaimer, the term of this patent is extended or adjusted under 35 U.S.C. 154(b) by 0 days.

(21) Appl. No.: 18/462,217

(22) Filed: Sep. 6, 2023

(65) Prior Publication Data

US 2023/0409525 A1 Dec. 21, 2023

Related U.S. Application Data

(63) Continuation of application No. PCT/EP2021/061610, filed on May 4, 2021.

(51) Int. Cl.
  *G06F 16/13* (2019.01)
  *G06F 16/17* (2019.01)
(52) U.S. Cl.
  CPC ........ *G06F 16/137* (2019.01); *G06F 16/1727* (2019.01)
(58) Field of Classification Search
  CPC .................... G06F 16/137; G06F 16/1727
  See application file for complete search history.

(56) References Cited

U.S. PATENT DOCUMENTS

| | | | | |
|---|---|---|---|---|
| 6,601,236 | B1 * | 7/2003 | Curtis | G06F 8/61 717/177 |
| 7,797,332 | B1 * | 9/2010 | Bove | G06F 21/51 707/706 |
| 7,814,078 | B1 * | 10/2010 | Forman | G06F 16/24554 707/698 |
| 8,041,803 | B2 * | 10/2011 | Yu | G06Q 30/06 709/227 |
| 8,386,792 | B1 * | 2/2013 | Zhao | G06F 21/6209 713/180 |
| 9,235,475 | B1 * | 1/2016 | Shilane | G06F 16/137 |

(Continued)

*Primary Examiner* — Debbie M Le
*Assistant Examiner* — Huen Wong
(74) *Attorney, Agent, or Firm* — Leydig, Voit & Mayer, Ltd.

(57) ABSTRACT

A system and method identifies target device file matches of a source file based on file size and hash values. The method includes storing a first source file hash value of the first source file, wherein the first source file hash value was generated by applying a hash function to the first source file, appending a first source file size to the first source file hash value to generate a first appended source file hash value, scanning a target file dataset comprising N target files, wherein the target file dataset is on a target device. Scanning includes determining a respective file size for each of the N target files in the target dataset, determining whether each of the N target files is a size-matching target file, wherein a size-matching target file is any target file of the N target files that matches the first source file size, and generating a respective target file hash value for each size-matching target file by applying the hash function to each size-matching target file.

11 Claims, 7 Drawing Sheets

(56) References Cited

U.S. PATENT DOCUMENTS

| | | | |
|---|---|---|---|
| 9,792,306 B1* | 10/2017 | Wartnick | G06F 16/2365 |
| 10,162,488 B1* | 12/2018 | Wang | G06F 21/10 |
| 10,303,797 B1 | 5/2019 | Menezes et al. | |
| 10,649,807 B1* | 5/2020 | Chinthekindi | H04L 9/0643 |
| 10,795,991 B1* | 10/2020 | Ross | G06F 21/554 |
| 2002/0107753 A1* | 8/2002 | Laughlin | G06Q 10/087 |
| | | | 705/28 |
| 2002/0174180 A1* | 11/2002 | Brown | G06F 16/1787 |
| | | | 707/999.01 |
| 2003/0037010 A1* | 2/2003 | Schmelzer | G06F 21/6209 |
| | | | 705/67 |
| 2007/0139231 A1* | 6/2007 | Wallia | H04L 63/1425 |
| | | | 341/50 |
| 2008/0022012 A1* | 1/2008 | Wang | H04L 47/34 |
| | | | 709/207 |
| 2008/0027867 A1* | 1/2008 | Forbes | G06F 21/10 |
| | | | 705/51 |
| 2008/0168152 A1* | 7/2008 | Weizman | H04L 67/1097 |
| | | | 709/213 |
| 2009/0172824 A1* | 7/2009 | Colburn | G06F 21/554 |
| | | | 707/E17.107 |
| 2009/0198651 A1* | 8/2009 | Shiffer | G06F 16/00 |
| 2010/0037062 A1* | 2/2010 | Carney | H04L 9/3247 |
| | | | 713/176 |
| 2010/0042790 A1* | 2/2010 | Mondal | G06F 3/0689 |
| | | | 709/215 |
| 2010/0198783 A1* | 8/2010 | Wang | G06F 16/80 |
| | | | 707/610 |
| 2010/0235333 A1* | 9/2010 | Bates | G06F 16/1748 |
| | | | 711/E12.001 |
| 2010/0250488 A1* | 9/2010 | Mayer | G06Q 10/06 |
| | | | 707/812 |
| 2011/0055471 A1* | 3/2011 | Thatcher | G06F 3/0679 |
| | | | 711/216 |
| 2013/0232187 A1* | 9/2013 | Workman | G06F 16/172 |
| | | | 709/203 |
| 2014/0052825 A1* | 2/2014 | Luecke | H04L 67/61 |
| | | | 709/219 |
| 2014/0149366 A1* | 5/2014 | Huang | G06F 3/0608 |
| | | | 707/687 |
| 2014/0188822 A1* | 7/2014 | Das | H03M 7/30 |
| | | | 707/693 |
| 2015/0058301 A1* | 2/2015 | Kolodner | G06F 16/1748 |
| | | | 707/692 |
| 2016/0134601 A1* | 5/2016 | Finlow-Bates | G09C 1/00 |
| | | | 713/165 |
| 2017/0230352 A1* | 8/2017 | Chen | H04L 63/0807 |
| 2018/0124034 A1* | 5/2018 | Duvall | H04L 9/3236 |
| 2018/0365418 A1* | 12/2018 | Godowski | G06F 21/53 |
| 2019/0188184 A1* | 6/2019 | Chittaro | G06F 16/152 |
| 2019/0379723 A1* | 12/2019 | Demasi | H04L 67/34 |
| 2020/0184278 A1* | 6/2020 | Zadeh | G06N 3/044 |
| 2020/0233752 A1 | 7/2020 | Wong et al. | |
| 2021/0357364 A1* | 11/2021 | Saliba | G06F 16/152 |
| 2023/0119183 A1* | 4/2023 | Wong | G06F 16/137 |
| | | | 707/822 |
| 2023/0224357 A1* | 7/2023 | Xu | H04L 67/5683 |
| | | | 709/217 |
| 2024/0111904 A1* | 4/2024 | Carpenter | H04L 9/3236 |

\* cited by examiner

METHOD FOR REDUCING PRIMARY AND BACKUP STORAGE

CROSS-REFERENCE TO RELATED APPLICATIONS

This application is a continuation of International Application No. PCT/EP2021/061610, filed on May 4, 2021, the disclosure of which is hereby incorporated by reference in its entirety.

TECHNICAL FIELD

The present disclosure relates generally to the field of data management; and more specifically, to a method, a data management device and a data storage system for reducing primary and backup storage.

BACKGROUND

Typically, data related to an entity, such as an enterprise or an organisation, is stored in terms of multiple data files and data objects which are further stored on various physical machines, virtual machines located on different hosts (e.g., VMware, Hyper-V, etc.) and data centres (e.g., network attached servers (NAS)). In case of storage of data in terms of the multiple data files and data objects, there may be duplicity of data files and similarity (i.e., partially same data) may also exist among the multiple data files, while saving the data related to the entire enterprise or the organisation.

Currently, certain methods are available in order to reduce storage requirements, such as by use of compression, or by de-duplication of duplicate data files and similar (i.e., partially same) data files. Data de-duplication may be defined as a technique to eliminate duplicate copies of repeating data. Storage reduction methods can be applied to both a primary storage cluster and a secondary (backup) storage cluster. In case of use of the secondary storage cluster, depending on the scalability of the secondary storage cluster and size of the data centre, more than one secondary storage cluster may be needed in order to protect one data centre. In a back-up, different backup layouts may be used to store the backed-up data, such as incremental block level, file level, and data de-duplication. In all these layouts, data to be stored is either compressed and/or encrypted. In this way, the duplicate data files and the similar data files which may be stored on the same data centre, their backup layout is de-duplicated and hence, the de-duped data files may be stored in a backup repository with a partial efficiency. Alternatively stated, the backup layout with de-duplication reduces the backup storage capacity only for a specific data centre or partial of the specific data centre. However, there are limitations associated with the available methods, such as the duplicate data files and the similar data files which may be stored on different data centres are not de-duped efficiently in the backup storage because of the secondary storage protection scope. Therefore, the duplicate data files and the similar data files located on different data centres will continue to occupy more space and would not leverage de-duplication technique of primary storage or secondary storage. Thus, there exists a technical problem of inefficiently and inadequately handling the primary storage as well as the backup storage.

Therefore, in light of the foregoing discussion, there exists a need to overcome the aforementioned drawbacks associated with the conventional methods of reducing the primary storage as well as the backup storage.

SUMMARY

The present disclosure provides a method for reducing primary as well as backup storage. The present disclosure further provides a data management device and a data storage system for reducing primary and backup storage. The present disclosure provides a solution to the existing problem of inefficiently and inadequately handling and reducing the primary storage as well as the backup storage. An aim of the present disclosure is to provide a solution that overcomes at least partially the problems encountered in prior art, and provide an improved method, a data management device and a data storage system for reducing primary as well as backup storage.

Embodiments of the present disclosure are provided provided in the enclosed independent claims. Implementations of the present disclosure are further defined in the dependent claims.

In one aspect, the present disclosure provides a computer-implemented method of data management in a data storage system comprising a plurality of data storage units. The method comprises dividing each file in the data storage system into a plurality of blocks having a common size. The method further comprises generating a hash value for each block using a common hash algorithm. The method further comprises identifying a plurality of similar files in different data storage units, based on a comparison of the hashes for each file. The method further comprises copying one or more of the identified similar files, such that similar files are stored in a single data storage unit and for one or more of the copied files, generating a link to a new location of the file.

The method of the present disclosure provides an efficient, effective, and adequate reduction of primary storage as well as backup storage space. The storage of duplicate files and similar (i.e., partially same) files on different data storage units (or secondary storage cluster) can now be performed on the same data storage unit (or cluster) and by leveraging data de-duplication technique, the backup storage space (or the secondary storage space) may be reduced significantly. Moreover, the disclosed method improves detection time of duplicate files and similar files across an entire enterprise storage or an organisation, which in turn reduces the data storage cost while improving accuracy and effectiveness of reducing both primary storage as well as the backup storage space.

In an implementation form, identifying the plurality of similar files includes collecting one or more hash values from each file in the data storage system and comparing the collected hash values.

The collection and comparison of the one or more hash values from each file in the data storage system provides a more precise identification of the plurality of similar files.

In a further implementation form, the method further comprises collecting a predefined number of hash values from each file, wherein the collected hash values are the highest for each file.

The collection of the predefined number of hash values from each file provides an information required for de-duplication of the plurality of similar files.

In a further implementation form, collecting hash values from each file in the data storage system includes filtering the hash values according to a minimum file size, or file type.

The filtering of hash values according to the minimum file size or file type provides an improved detection time of duplicate files and similar (i.e., partially the same) files across an entire enterprise storage or an organisation.

In a further implementation form, identifying the plurality of similar files includes determining a percentage number of blocks in common and comparing the determined percentage to a minimum threshold value.

The determination of the percentage number of blocks in common followed by comparison of the determined percentage to the minimum threshold value provides a further precision in identification of the plurality of similar files.

In a further implementation form, copying the identified similar files comprises copying both files to a centralised data storage unit.

The identified similar files are copied to the centralised data storage unit in order to maximise the benefit from data de-duplication.

In a further implementation form, the copying the similar files comprises selecting the data storage unit of one file as an optimal storage location, and copying one or more other similar files to the optimal storage location.

The selection of the optimal storage location results into a significant reduction of the backup storage space (or the secondary storage space).

In a further implementation form, the optimal storage location is selected to minimise the volume of data to be copied.

The selection of the optimal storage location provides de-duplication of volume of data with more ease.

In a further implementation form, the optimal storage location is selected based on an access speed or reliability of the data storage units.

The selection of the optimal storage location also provides a protection of a sensitive data.

In a further implementation form, the data storage system is a network-based system.

By virtue of having the data storage system as the network-based system, the storage space (i.e., the primary as well as secondary storage space) of an entire enterprise or an organisation may be efficiently used.

In another aspect, the present disclosure provides a computer-readable medium configured to store instruction which, when executed by a processor, cause the processor to perform the method.

The processor (e.g., processor of a device or a system) achieves all the advantages and effects of the method after execution of the method.

In a yet another aspect, the present disclosure provides a data management device for a data storage system comprising a plurality of data storage units, the data management device configured to divide each file in the data storage system into a plurality of blocks having a common size. The data management device is further configured to generate a hash value for each block using a common hash algorithm. The data management device is further configured to identify a plurality of similar files in different data storages, based on a comparison of the hashes for each file. The data management device is further configured to copy one or more of the identified similar files, such that similar files are stored in a single data storage and for one or more of the copied files, generate a link to a new location of file.

The data management device achieves all the advantages and effects of the method of the present disclosure.

In a yet another aspect, the present disclosure provides a data storage system comprising one or more interconnected data storage units and the data management device.

The data storage system achieves all the advantages and effects of the data management device as well as the method of the present disclosure.

It is to be appreciated that all the aforementioned implementation forms can be combined.

It has to be noted that all devices, elements, circuitry, units and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof. It will be appreciated that features of the present disclosure are susceptible to being combined in various combinations without departing from the scope of the present disclosure as defined by the appended claims.

Additional aspects, advantages, features and objects of the present disclosure would be made apparent from the drawings and the detailed description of the illustrative implementations construed in conjunction with the appended claims that follow.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognise that other embodiments for carrying out or practicing the present disclosure are also possible.

Figure 1:
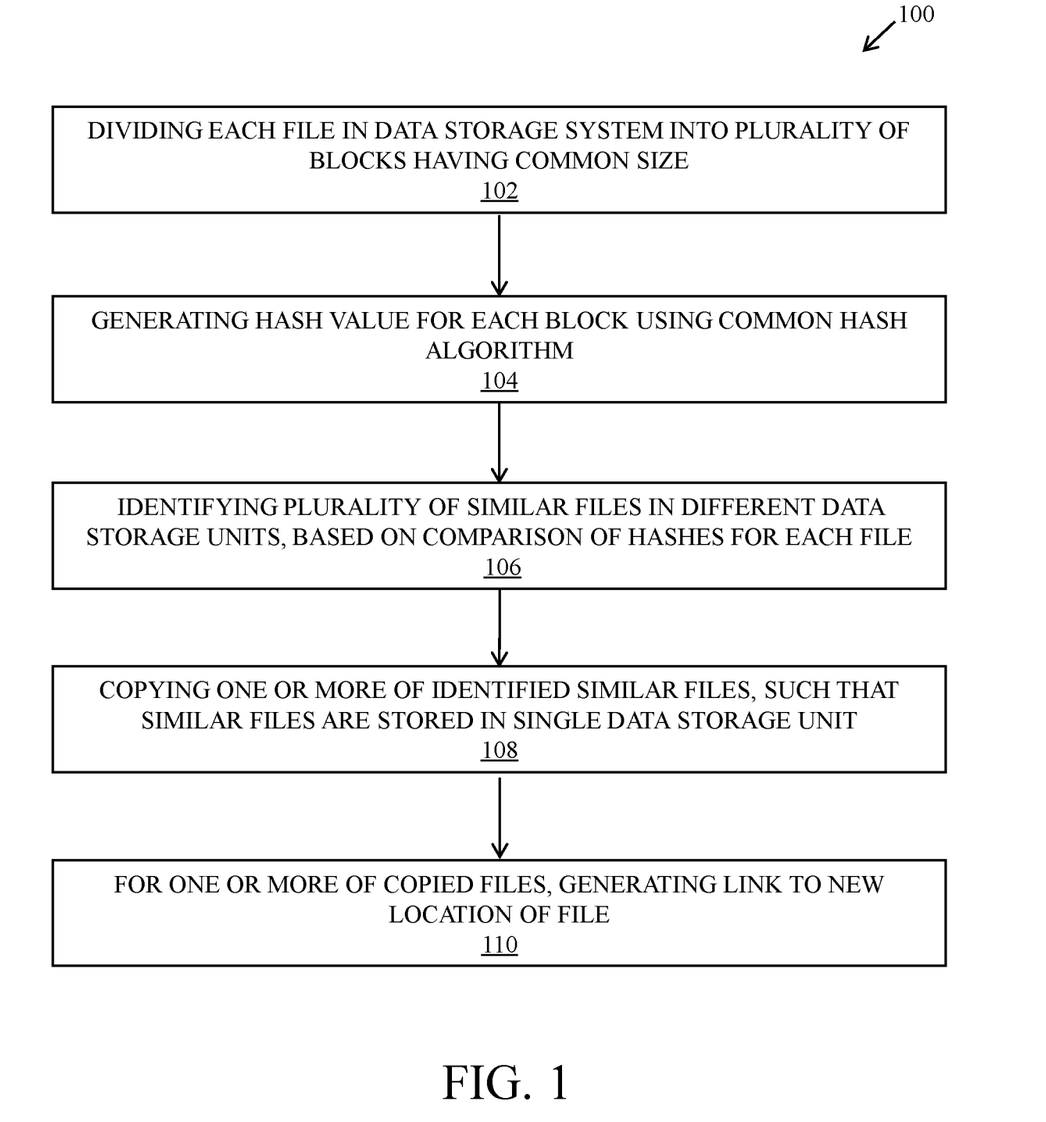
FIG. 1 is a flowchart of a method of data management in a data storage system comprising a plurality of data storage units, in accordance with an embodiment of the present disclosure.

FIG. 1 is a flowchart of a method of data management in a data storage system comprising a plurality of data storage units, in accordance with an embodiment of the present disclosure. With reference to FIG. 1, there is shown a method 100 of data management in a data storage system comprising a plurality of data storage units. The method 100 includes steps 102-to-110. The method 100 is executed by a data management device and a data storage system, described in detail, for example, in FIGS. 2 and 3, respectively.

The present disclosure provides a computer-implemented method (i.e., the method 100) of data management in a data storage system comprising a plurality of data storage units, the method 100 comprising:
dividing each file in the data storage system into a plurality of blocks having a common size;
generating a hash value for each block using a common hash algorithm;
identifying a plurality of similar files in different data storage units, based on a comparison of the hashes for each file;
copying one or more of the identified similar files, such that similar files are stored in a single data storage unit; and
for one or more of the copied files, generating a link to a new location of the file.

The method 100 improves an unstructured data management of an entire enterprise storage system. The method 100 includes collecting information of an unstructured data that may be stored on different sources of the entire enterprise storage, such as a data centre (e.g., network attached server (NAS)), a data object (e.g., Amazon S3), a virtual machine (VM), or a physical machine, etc. The information may be collected either periodically or as a "live update". The collected information may be a native meta data with an additional synthetic data, for example, input or output temperature of a file.

At step 102, the method 100 comprises dividing each file in the data storage system into a plurality of blocks having a common size. For example, video file or an audio file is divided into the plurality of blocks while saving the video file or the audio file in the data storage system (e.g., a data centre, or a NAS). Each of the plurality of blocks is of the common size but has different data. The data storage system may have one or more data storage units (or devices), such as physical machines, virtual machines, data centres (or network attached servers), and the like. The data storage system represents a storage system of the entire enterprise storage or an organisation.

At step 104, the method 100 further comprises generating a hash value for each block using a common hash algorithm. The hash value for each block of the plurality of blocks is generated by use of the common hash algorithm. For example, a secure hash algorithm 1 (SHA-1) may be used to generate the hash for each block of the plurality of blocks. Generally, the secure hash algorithm 1 (SHA-1) may be defined as a cryptographic hash function which takes an input and generates a hash value of 160 bits in output.

At step 106, the method 100 further comprises identifying a plurality of similar files in different data storage units, based on a comparison of the hashes for each file. In an example, multiple video files or audio files may be stored on different data centres (or network attached servers), or physical machines or virtual machines. In such a case, the hash (or the hash value) associated with each block of the plurality of blocks of each video file or the audio file is compared with each other. After comparison, the plurality of similar files (i.e., the files having each block of the plurality of blocks having same hashes or hash values) is identified. For example, the multiple video files or audio files may be identified as the plurality of similar files if 5 highest weak hashes stored per file are found as same.

At step 108, the method 100 further comprises copying one or more of the identified similar files, such that similar files are stored in a single data storage unit. The one or more of the identified similar files are copied in the single data storage unit (e.g., a centralised network attached server) in order to ease the de-duplication of the one or more of the identified similar files resulting into reduction of primary storage. This further results into an improved detection time of duplicate and similar files stored across the entire enterprise storage.

At step 110, the method 100 further comprises for one or more of the copied files, generating a link to a new location of the file. The one or more of the identified similar files which are stored (or copied) in the single data storage unit are termed as the one or more copied files. For each of the one or more copied files, the link to the new location (i.e., the centralised network attached server) is provided as a stub in the source file, hence, results into reduction of primary storage as well as secondary storage.

In accordance with an embodiment, identifying the plurality of similar files includes collecting one or more hash values from each file in the data storage system and comparing the collected hash values. The plurality of similar files is identified by collecting one or more hash values (or the hashes) associated with the plurality of blocks of each file stored in the data storage system. The collected one or more hash values (or the hashes) associated with the plurality of blocks of each file that is stored in the data storage system, are compared with each other.

In accordance with an embodiment, the method 100 further comprises collecting a predefined number of hash values from each file, wherein the collected hash values are the highest for each file. For comparison of the one or more hash values (or the hashes) associated with the plurality of blocks of each file, the predefined number of hash values from each file are collected. The collected hash values are the highest hash values stored per file. For example, the plurality of similar files may be identified if 5 highest weak hashes (e.g., weak hash—8 bytes) stored per file are collected from one or more data storage systems and found as same on comparison with each other. The 5 highest weak hashes stored per file may be collected in various ways, for example, by use of primary storage, such as an application programming interface (API).

In accordance with an embodiment, collecting hash values from each file in the data storage system includes filtering the hash values according to a minimum file size, or file type. The collection of the hash values of the plurality of blocks of each file in the data storage system depends on filtering the hash values based on the minimum file size or the file type, such as .jpg file, or .mpeg file, etc.

In accordance with an embodiment, identifying the plurality of similar files includes determining a percentage number of blocks in common and comparing the determined percentage to a minimum threshold value. The plurality of similar files is identified on the basis of the percentage number of blocks which are common in one or more files. Moreover, the percentage number of blocks common in one or more files are compared to the minimum threshold value. For example, a video file stored in the data storage system is divided into 3 blocks. Another video file stored in the data storage system is divided into 4 blocks. The first two blocks of the video file and the other video file are common in both the files. Therefore, the percentage number of blocks in common among the video file and the other video file may be approximately 57 percent. The percentage number of blocks in common (i.e., the 57%) is further compared with the minimum threshold value.

In accordance with an embodiment, copying the identified similar files comprises copying both files to a centralised data storage unit. The identified similar files are copied to the centralised data storage unit (e.g., a centralised network attached server) so that the identified similar files are de-duped by the centralised data storage unit with more ease resulting into reduction of primary storage as well as secondary storage. The storage (or backup) of similar files that were stored on different data storage units (or secondary storage cluster) can now be stored on the same data storage unit (or cluster) and by leveraging data de-duplication technique, the backup storage space (or the secondary storage space) may be reduced significantly.

In accordance with an embodiment, copying the similar files comprises selecting the data storage unit of one file as an optimal storage location, and copying one or more other similar files to the optimal storage location. For example, in case of two identified similar files, the data storage unit of a bigger file among the two identified similar files is considered as the optimal storage location and a smaller file among the two identified similar files is copied to the optimal storage location.

In accordance with an embodiment, the optimal storage location is selected to minimise the volume of data to be copied. The optimal storage location is selected in order to ease the data de-duplication of the volume of data to be copied to the optimal storage location. For example, the centralised network attached server is selected as the optimal storage location in order to minimise the volume of data to be copied by use of the data de-duplication.

In accordance with an embodiment, the optimal storage location is selected based on an access speed or reliability of the data storage units. For example, in case of a sensitive or an important data, the selection of the optimal storage location is performed on the basis of the access speed or reliability of the data storage units. In case of the sensitive data, the identified similar files are copied to multiple data storage units rather than one data storage unit. In such a case, the access speed and reliability of the multiple data storage units is of primary concern due to protection level of the sensitive data.

In accordance with an embodiment, the data storage system is a network-based system. The data storage system is the network-based system, such as the centralised network attached server (NAS), or a cloud network which is linked with a network, for example, an internet.

Thus, the method 100 efficiently reduces the primary storage as well as the secondary storage space. The storage (or backup) of duplicate files and similar (i.e., partially the same) files that were stored on different data storage units (or secondary storage cluster) can now be stored on the same data storage unit (or cluster) and by leveraging data de-duplication technique, the backup storage space (or the secondary storage space) may be reduced significantly. Moreover, the method 100 improves detection time of duplicate files and similar (i.e., partially the same) files across the entire enterprise storage.

The steps 102 to 110 are only illustrative and other alternatives can also be provided where one or more steps are added, one or more steps are removed, or one or more steps are provided in a different sequence without departing from the scope of the claims herein.

Figure 2:
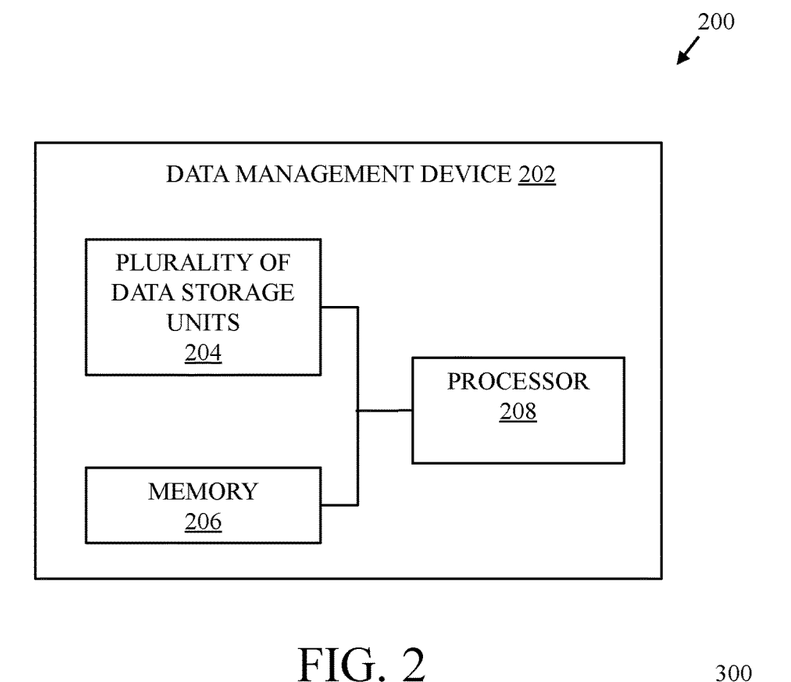
FIG. 2 is a block diagram that illustrates various exemplary components of a data management device, in accordance with an embodiment of the present disclosure.

FIG. 2 is a block diagram that illustrates various exemplary components of a data management device, in accordance with an embodiment of the present disclosure. FIG. 2 is described in conjunction with elements from FIG. 1. With reference to FIG. 2, there is shown a block diagram 200 of a data management device 202 for a data storage system that includes a plurality of data storage units 204, a memory 206 and a processor 208. The plurality of data storage units 204 and the memory 206 may be communicatively coupled to the processor 208. The processor 208 of the data management device 202 executes the method 100 (of FIG. 1). The data storage system is described in detail, for example, in FIG. 3.

The data management device 202 includes suitable logic, circuitry, interfaces, or code that is configured to collect information of an unstructured data that may be stored on different data storage units of the entire enterprise storage, such as a data centre (e.g., network attached server (NAS)), a data object (e.g., Amazon S3), a virtual machine (VM), or a physical machine, etc. The information may be collected either periodically or as a "live update" by use of the plurality of data storage units 204 (e.g., collector). The plurality of data storage units 204 (e.g., collector) may run in-host or outside of the host. The collected information may be a native meta data with an additional synthetic data, for example, input or output temperature of a file may be obtained by calculating number of reads per file in the last 24 hours or any other synthetic information. The data management device 202 may be configured to run different type of queries and perform an analysis and supply insights on a customer storage enterprise. For example, the data management device 202 may be configured to find hot and cold data according to a customer policy. Examples of the data management device 202 include, but are not limited to an artificial intelligence (AI) catalog engine, a mainframe computer, and the like. In an example, the data management device 202 may be a single computing device or an electronic device. In another example, the data management device 202 may be a plurality of computing devices, or electronic devices, operating in a parallel or distributed architecture. In a yet another example, the data management device 202 may be implemented as a computer program that provides various services (such as database management) to other devices, modules or apparatus.

The plurality of data storage units 204 includes suitable logic, circuitry, interfaces, or code that is configured to store data. Examples of the plurality of data storage units 204 include, but are not limited to a primary storage (e.g., the memory 206), a secondary storage, such as a memory of a virtual machine, a network attached server (NAS), a collector, and the like. The virtual machine may be located on different hosts or hosts type, such as VMware, Hyper-V, etc.

The memory 206 includes suitable logic, circuitry, interfaces, or code that is configured to store data and the instructions executable by the processor 208. Examples of implementation of the memory 206 may include, but are not limited to, an Electrically Erasable Programmable Read-Only Memory (EEPROM), Random Access Memory (RAM), Read Only Memory (ROM), Hard Disk Drive (HDD), Flash memory, Solid-State Drive (SSD), or CPU cache memory. The memory 206 may store an operating system or other program products (including one or more operation algorithms) to operate the data management device 202.

The processor 208 includes suitable logic, circuitry, interfaces, or code that is configured to execute the instructions stored in the memory 206. In an example, the processor 208 may be a general-purpose processor. Other examples of the processor 208 may include, but is not limited to a microprocessor, a micro-controller, a complex instruction set computing (CISC) processor, an application-specific integrated circuit (ASIC) processor, a reduced instruction set (RISC) processor, a very long instruction word (VLIW) processor, a central processing unit (CPU), a state machine, a data processing unit, and other processors or control circuitry. Moreover, the processor 208 may refer to one or more individual processors, processing devices, a processing unit that is part of a machine, such as the data management device 202.

In operation, the data management device 202 is configured to divide each file in the data storage system into a plurality of blocks having a common size. For example, the data management device 202 (e.g., AI catalog engine) divides a data file (e.g., video file, audio file, .jpg file, .mpeg file, etc.) into the plurality of blocks while saving the data file into the data storage system. Each of the plurality of blocks is of the common size but has different data.

The data management device 202 is further configured to generate a hash value for each block using a common hash algorithm. The hash value for each block of the plurality of blocks of the data file may be generated by use of the common hash algorithm, for example, a secure hash algorithm 1 (SHA-1).

The data management device 202 is further configured to identify a plurality of similar files in different data storages, based on a comparison of the hashes for each file. In a case, multiple data files may be stored on the plurality of data storage units 204 (e.g., collectors) of the data management device 202. The plurality of data storage units 204 may be configured to provide information of the unstructured data to the data management device 202, such as a file system (e.g., NAS) native metadata, synthetic metadata properties such as statistics (e.g., average changes per day), collector ID, unique NAS information, etc. The plurality of data storage units 204 may be configured to obtain de-duplication information. For example, the plurality of data storage units 204 may be configured to obtain for each file 5 highest weak hashes and that may be performed in various ways, such as by use of a primary storage API. Additionally, the plurality of data storage units 204 may be configured to provide the information about the hash algorithm and block size to the data management device 202 in order to process each file and store each file into a backend (i.e., persistent storage, e.g., elastic search). After receiving the information form the plurality of data storage units 204, the data management device 202 is configured to run periodic queries in order to find the plurality of similar files. In such a case, data management device 202 is configured to compare the hash (or the hash value) associated with each block of the plurality of blocks of each data file stored on the plurality of data storage units 204. After comparison, data management device 202 identifies the plurality of similar files by finding a similarity greater than equal to a certain threshold value (i.e., x %). The threshold value is obtained by finding same hashes for each block of the plurality of blocks of each file.

The data management device 202 is further configured to copy one or more of the identified similar files, such that similar files are stored in a single data storage. After identification of the plurality of similar files, the data management device 202 is configured to copy the one or more identified similar files in the single data storage (e.g., a centralised network attached server) in order to ease de-duplication of the one or more of the identified similar files resulting into reduction of primary storage of the data management device 202.

The data management device 202 is further configured to for one or more of the copied files, generate a link to a new location of file. After copying the one or more identified similar files, the data management device 202 is further configured to generate the link of the new location for each of the one or more copied files in a source file. This further results into reduction of primary storage as well as secondary storage of the data management device 202.

In accordance with an embodiment, identifying the plurality of similar files includes collecting one or more hash values from each file in the data storage system and comparing the collected hash values. The data management device 202 is configured to identify the plurality of similar files by collecting and then, comparing one or more hash values (or the hashes) associated with each of the plurality of blocks of each file stored in the data storage system.

In accordance with an embodiment, the data management device 202 is further configured to collect a predefined number of hash values from each file, wherein the collected hash values are the highest for each file. For example, the plurality of similar files may be identified if 5 highest weak hashes (e.g., weak hash—8 bytes) stored per file are collected from the data storage system and found as same on comparison with each other.

In accordance with an embodiment, collecting hash values from each file in the data storage system includes filtering the hash values according to a minimum file size, or file type. The data management device 202 is further configured to filter the hash values collected from each file on the basis of the minimum file size of the file type, such as the .jpg file, or .mpeg file, etc.

In accordance with an embodiment, identifying the plurality of similar files includes determining a percentage number of blocks in common and comparing the determined percentage to a minimum threshold value. The data management device 202 is configured to identify the plurality of similar files on the basis of the percentage number of blocks which are common in one or more files. Moreover, the percentage number of blocks common in one or more files are compared to the minimum threshold value.

In accordance with an embodiment, copying the identified similar files comprises copying both files to a centralised data storage. The data management device 202 is configured to copy the identified similar files to the centralised data storage (e.g., a centralised and configurable network attached server) so that the identified similar files are de-duped with more ease resulting into reduction of primary storage as well as secondary storage (i.e., the memory 206) of the data management device 202.

In accordance with an embodiment, copying the similar files comprises selecting the data storage of one file as an optimal storage location, and copying one or more other similar files to the optimal storage location. The data management device 202 is configured to select the optimal storage location. In an example, the data management device 202 may decide for the similar files to which network attached server (NAS) to copy them in order to obtain maximum benefit from de-duplication and replace with the link of the new location for each of the one or more copied files in a source file.

In accordance with an embodiment, the optimal storage location is selected to minimise the volume of data to be copied. The data management device 202 is configured to select the optimal storage location in order to ease the de-duplication of the one or more copied files resulting into reduction of volume of data to be copied.

In accordance with an embodiment, the optimal storage location is selected based on an access speed or reliability of the data storage. For example, in case of a sensitive data, the data management device 202 is configured to select the optimal storage location on the basis of protection level of the sensitive data. In such a case, the data management device 202 is configured to copy the identified similar files to multiple data storage units rather than one data storage unit. In such a case, the access speed and reliability of the multiple data storage units is of primary concern due to protection level of the sensitive data.

In accordance with an embodiment, the data storage system is a network-based system. The data storage system is the network-based system, such as the centralised network attached server (NAS), or a cloud network which is linked with a network, for example, an internet.

In accordance with an embodiment, a computer-readable medium configured to store instruction which, when executed by the processor 208, cause the processor 208 to perform the method 100 (of FIG. 1). The processor 208 of the data management device 202 is configured to execute the method 100 (of FIG. 1).

Thus, the data management device 202 (i.e., the AI catalog engine) efficiently manages the unstructured data that is stored on the entire enterprise storage by collecting the information of the unstructured data using the plurality of data storage units 204. The data management device 202 (i.e., the AI catalog engine) provides the information of the plurality of similar files and copy them to the centralised and configurable data storage system and replace each of the plurality of similar files with the corresponding stub (i.e., the link of the new location) in the source file system. This results into an improved de-duplication of the plurality of similar files copied on the centralised data storage system and hence, into reduction of primary storage and secondary storage of the data management device 202. Additionally, the data management device 202 improves detection time of the plurality of similar files across the entire enterprise storage.

Figure 3:
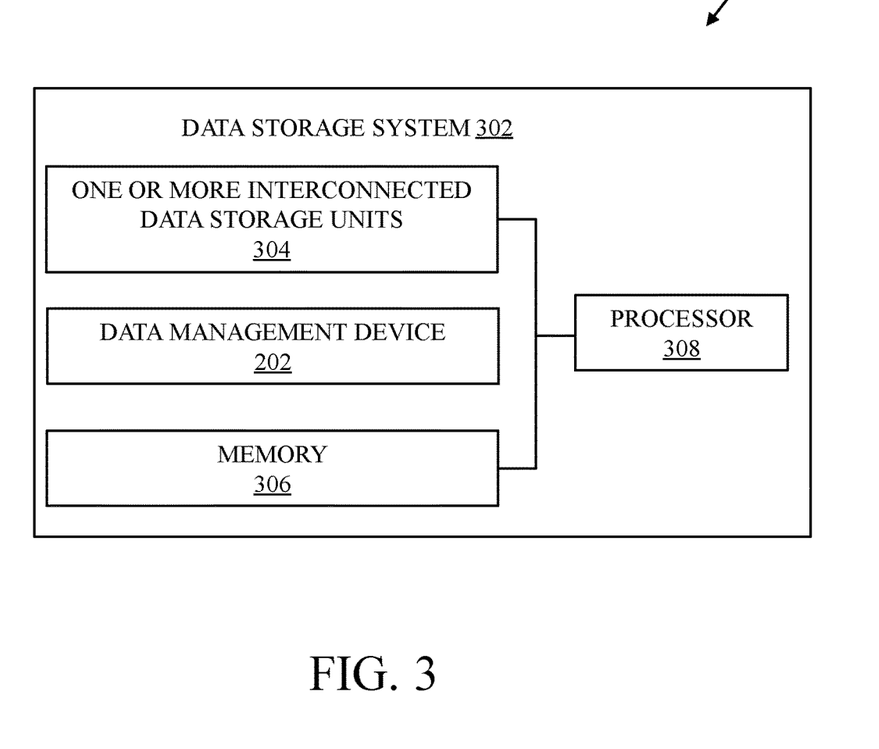
FIG. 3 is a block diagram that illustrates various exemplary components of a data storage system, in accordance with an embodiment of the present disclosure.

FIG. 3 is a block diagram that illustrates various exemplary components of a data storage system, in accordance with an embodiment of the present disclosure. FIG. 3 is described in conjunction with elements from FIGS. 1, and 2. With reference to FIG. 3, there is shown a block diagram 300 of a data storage system 302 that includes one or more interconnected data storage units 304, a memory 306 and a processor 308. The one or more interconnected data storage units 304, and the memory 306 may be communicatively coupled to the processor 308. The processor 308 of the data storage system 302 executes the method 100 (of FIG. 1).

The data storage system 302 includes suitable logic, circuitry, interfaces, or code that is configured to store data.

The data storage system 302 may have one or more data storage units (or devices), such as physical machines, virtual machines, data centres (or network attached servers), collectors, and the like. The data storage system 302 represents a storage system of the entire enterprise storage or a subset of the entire enterprise or an organisation. Examples of the data storage system 302 may include, but are not limited to a data centre, network attached server, and the like.

The one or more interconnected data storage units 304 corresponds to the plurality of data storage units 204 of the data management device 202 (of FIG. 2).

The memory 306 includes suitable logic, circuitry, interfaces, or code that is configured to store data and the instructions executable by the processor 308. Examples of implementation of the memory 306 may include, but are not limited to, an Electrically Erasable Programmable Read-Only Memory (EEPROM), Random Access Memory (RAM), Read Only Memory (ROM), Hard Disk Drive (HDD), Flash memory, Solid-State Drive (SSD), or CPU cache memory. The memory 306 may store an operating system or other program products (including one or more operation algorithms) to operate the data storage system 302.

The processor 308 includes suitable logic, circuitry, interfaces, or code that is configured to execute the instructions stored in the memory 306. In an example, the processor 308 may be a general-purpose processor. Other examples of the processor 308 may include, but is not limited to a microprocessor, a micro-controller, a complex instruction set computing (CISC) processor, an application-specific integrated circuit (ASIC) processor, a reduced instruction set (RISC) processor, a very long instruction word (VLIW) processor, a central processing unit (CPU), a state machine, a data processing unit, and other processors or control circuitry. Moreover, the processor 308 may refer to one or more individual processors, processing devices, a processing unit that is part of a machine, such as the data storage system 302.

Figure 4:
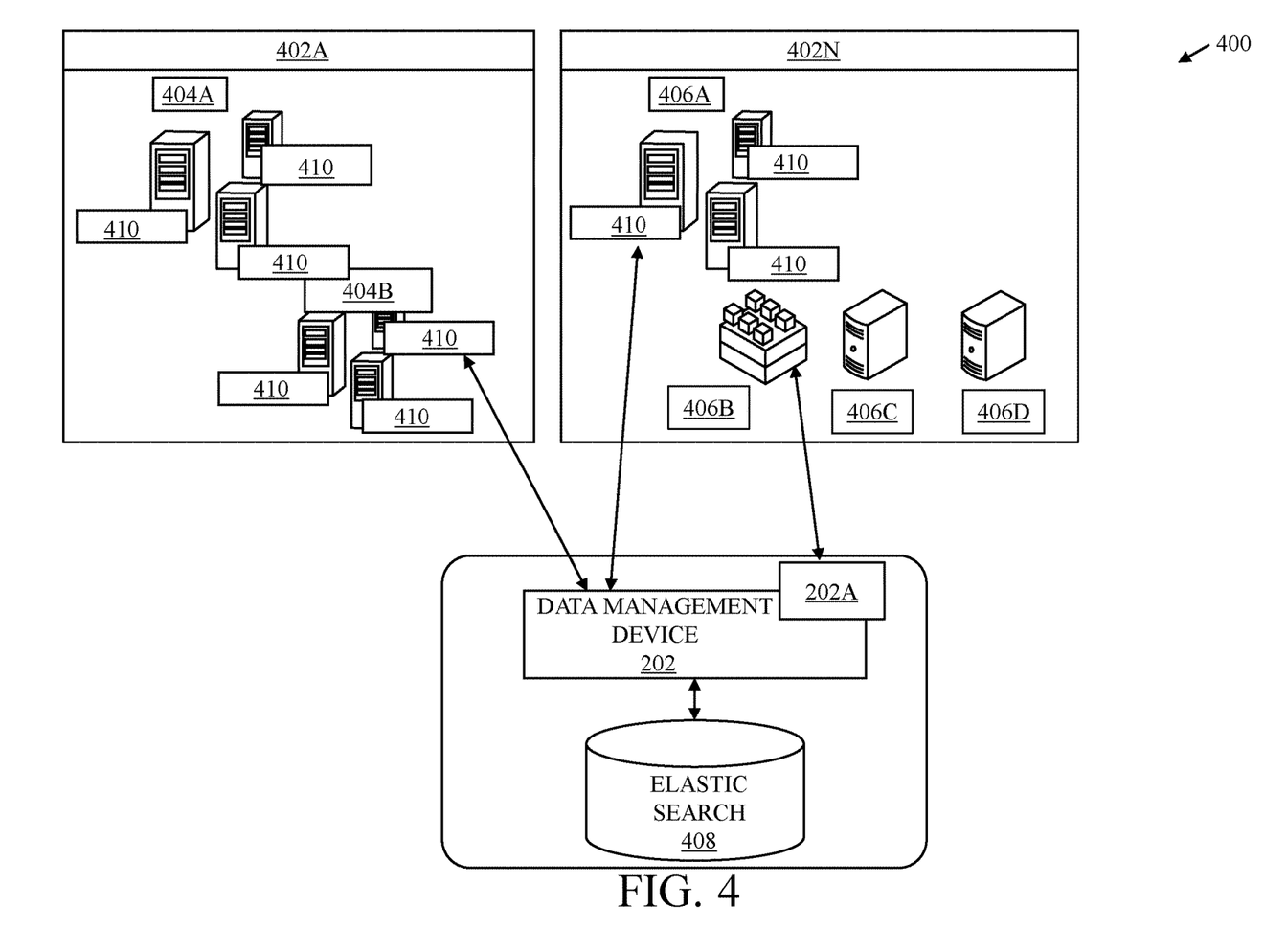
FIG. 4 is a network environment diagram of communication between the data storage system and the data management device, in accordance with an embodiment of the present disclosure.

FIG. 4 is a network environment diagram of communication between the data storage system and the data management device, in accordance with an embodiment of the present disclosure. FIG. 4 is described in conjunction with elements from FIGS. 1, 2, and 3. With reference to FIG. 4, there is shown a network environment 400 that includes a plurality of data storage systems, such as a first data storage system 402A up to a Nth data storage system 402N. The first data storage system 402A includes one or more interconnected data storage units, such as a first data storage unit 404A, and a second data storage unit 404B. Similarly, the Nth data storage system 402N includes one or more interconnected data storage units, such as a first data storage unit 406A, a second data storage unit 406B, a third data storage unit 406C and a fourth data storage unit 406D. The network environment 400 further includes the data management device 202 and an elastic search 408. The data management device 202 further includes an internal collector 202A. Each of the first data storage unit 404A, and the second data storage unit 404B of the first data storage system 402A includes a collector 410. Similarly, the first data storage unit 406A of the Nth data storage system 402N includes the collector 410.

In the network environment 400, the data management device 202 is configured to receive the data from the plurality of data storage systems, such as the first data storage system 402A up to the Nth data storage system 402N. In an example, the first data storage system 402A and the Nth data storage system 402N may also be represented as a data centre 1 and a data centre N, respectively. The first data storage unit 404A and the second data storage unit 404B of the first data storage system 402A may be represented as a network attached server 1 (NAS1) and a data object (e.g., S3). Similarly, the first data storage unit 406A, the second data storage unit 406B, the third data storage unit 406C and the fourth data storage unit 406D of the Nth data storage system 402N may be represented as a network attached server 7 (NAS7), production ESX server, production MSSQL and production oracle, respectively.

The collector 410 associated with the first data storage units 404A, 406A and the second data storage unit 404B may be defined as an agent that run inside or outside the first data storage units 404A, and 406A and the second data storage unit 404B, respectively and collect metadata of various data files. In an implementation, the collector 410 may also be referred to as a software implemented on the first data storage units 404A, and 406A and the second data storage unit 404B, and configured to access data files, data objects and the like, and perform various functions associated with the data backup. The collector 410 may be configured to detect one or more operations executing one or more changes in the data files.

The data management device 202 (i.e., AI catalog engine) is configured to manage the data (i.e., unstructured data) that is stored on the plurality of data storage systems, such as the first data storage system 402A up to the Nth data storage system 402N. Moreover, the internal collector 202A associated with the data management device 202 (i.e., AI catalog engine) may be configured to collect the data from each of the second data storage unit 406B (i.e., the production ESX server), the third data storage unit 406C (i.e., the production MSSQL) and the fourth data storage unit 406D (i.e., the production oracle) of the Nth data storage system 402N. The data management device 202 (i.e., AI catalog engine) may also be configured to move data (i.e., data files or data objects) between different tiers (e.g., from NAS1 to NAS7) or internally (e.g., from NAS1 to S3). The data management device 202 (i.e., AI catalog engine) is configured to provide the information on a plurality of similar files and copy them to the centralised and configurable data storage system and replace each of the plurality of similar files with the corresponding stub (i.e., the link of the new location) in the source file system. This results into an improved de-duplication of the plurality of similar files copied on the centralised data storage system and hence, into reduction of primary storage and secondary storage of the data management device 202. Additionally, the data management device 202 improves detection time of the plurality of similar files across the plurality of data storage systems, such as the first data storage system 402A up to the Nth data storage system 402N. Moreover, the data management device 202 (i.e., AI catalog engine) may also be configured to store each processed data file into the elastic search 408 which acts as a backup repository or a persistent storage.

Figure 5A:
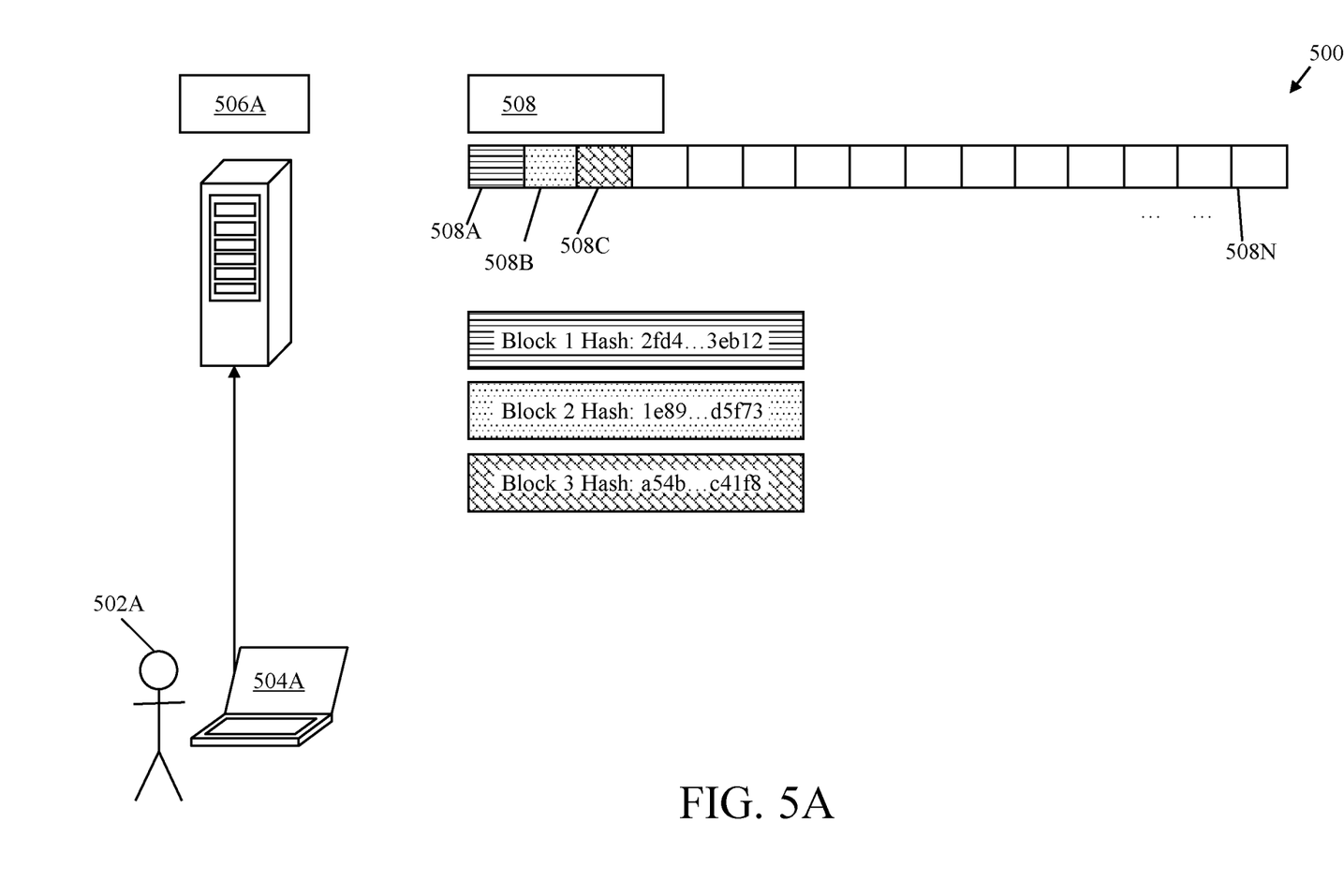
FIGS. 5A-5D collectively is an illustration of an exemplary scenario of implementation of the data storage system and the data management device, in accordance with an embodiment of the present disclosure.

FIGS. 5A-5D collectively is an illustration of an exemplary scenario of implementation of the data storage system and the data management device, in accordance with an embodiment of the present disclosure. FIGS. 5A-5D are described in conjunction with elements from FIGS. 1, 2, 3, and 4. With reference to FIGS. 5A-5D, there is collectively shown an implementation scenario 500. With reference to FIG. 5A, there is shown a first user 502A, a first computing device 504A, and a first network attached server 506A (also represented as NAS1). There is further shown a storage representation 508 of the first network attached server 506A (i.e., NAS1) that includes N number of blocks namely, a first block 508A, a second block 508B, a third block 508C and up to a Nth block 508N.

Figure 5B:
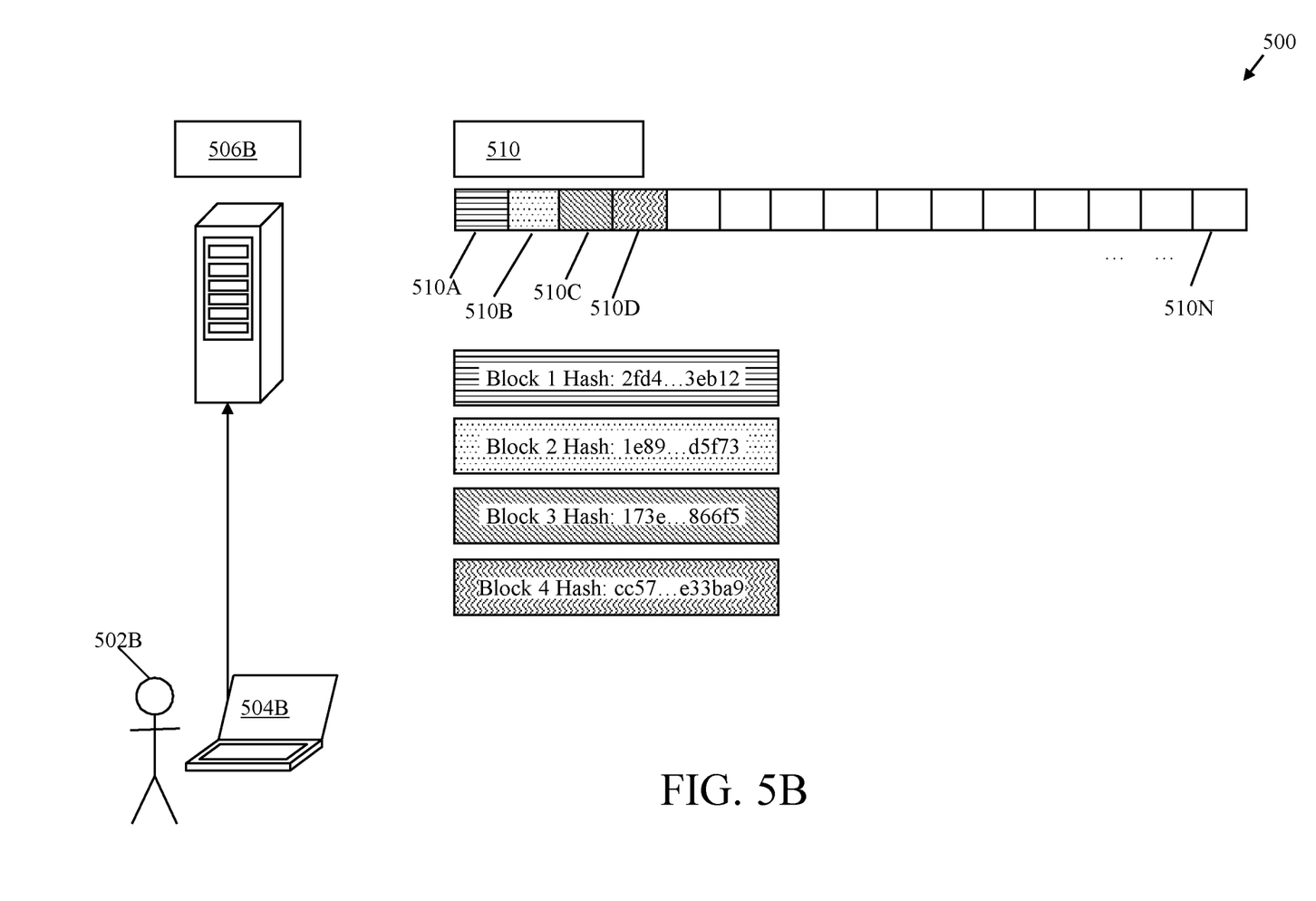

With reference to FIG. 5B, there is shown a second user 502B, a second computing device 504B, and a second network attached server 506B (also represented as NAS2). There is further shown a storage representation 510 of the second network attached server 506B (i.e., NAS2) that includes N number of blocks namely, a first block 510A, a second block 510B, a third block 510C, a fourth block 510D and up to a Nth block 510N.

With reference to the implementation scenario 500, the first user 502A and the second user 502B work together in an organisation (e.g., in a company "x") and has its own NAS share to upload their corresponding data files.

Referring back to FIG. 5A, the first user 502A receives a movie file of the company's event on the first computing device 504A. The movie file is named as "CompanyEvent.mpeg". The first user 502A copies the movie file from the first computing device 504A to the first network attached server 506A (i.e., NAS1). The link of the movie file "CompanyEvent.mpeg" on the first network attached server 506A (i.e., NAS1) is "\\nas1_IP\user1\MyVideos\CompanyEvent.mpeg". The movie file "CompanyEvent.mpeg" is stored on three blocks of the first network attached server 506A (i.e., NAS1), such as the first block 508A, the second block 508B and the third block 508C. Each of the first block 508A, the second block 508B and the third block 508C has different data and different hash value. For example, the hash value associated with the first block 508A, the second block 508B and the third block 508C is "Block1 Hash: 2fd4 . . . 3eb12", "Block2 Hash: 1e89 . . . d5f73", and "Block3 Hash: a54b . . . c41f8", respectively.

Now referring to FIG. 5B, the second user 502B receives the same movie file (i.e., "CompanyEvent.mpeg") of the company's event on the second computing device 504B. The second user 502B may be configured to perform some editing to the movie file and concatenate an additional short movie from the company event and created a new movie file which is named as "CompanyEvent_v2.mpeg". The second user 502B copies the new movie file from the second computing device 504B to the second network attached server 506B (i.e., NAS2). The link of the new movie file "CompanyEvent_v2.mpeg" on the second network attached server 506B (i.e., NAS2) is "\\nas2_IP\user2\MyDocs\videos\CompanyEvent_v2.mpeg". The new movie file "CompanyEvent_v2.mpeg" is stored on four blocks of the second network attached server 506B (i.e., NAS2), such as the first block 510A, the second block 510B, the third block 510C, and the fourth block 510D. Each of the first block 510A, the second block 510B, the third block 510C and the fourth block 510D has different data and different hash value. For example, hash values associated with the first block 510A, the second block 510B, the third block 510C, and the fourth block 510D are "Block1 Hash: 2fd4 . . . 3eb12", "Block2 Hash: 1e89 . . . d5f73", "Block3 Hash: 173e . . . 866f5", and "Block4 Hash: cc57 . . . e33ba9", respectively.

The movie file "CompanyEvent.mpeg" and the new movie file "CompanyEvent_v2.mpeg" are approximately similar. The reason is each of the first blocks 508A and 510A and each of the second blocks 508B and 510B of the movie file "CompanyEvent.mpeg" and the new movie file "CompanyEvent_v2.mpeg" is same and has same hash value and colour. Each of the third blocks 508C and 510C of the movie file "CompanyEvent.mpeg" and the new movie file "CompanyEvent_v2.mpeg" is different from each other and has different hash value and colour. The fourth block 510D exists only for the new movie file "CompanyEvent_v2.mpeg". In such a case, the data management device 202 (i.e., AI catalog engine) is configured to identify a plurality of similar files that is the movie file "CompanyEvent.mpeg" and the new movie file "CompanyEvent_v2.mpeg". The data management device 202 (i.e., AI catalog engine) is further configured to copy the movie file "CompanyEvent.mpeg" of the first user 502A to the second network attached server 506B (i.e., NAS2) whose link is "\\nas2_IP\similarFiles\fromUser1\MyVideos\CompanyEvent.mpeg" and replace the source on the first network attached server 506A (i.e., NAS1) with a stub (i.e., a link to the new location in the second network attached server 506B), as shown in FIG. 5C.

Figure 5C:
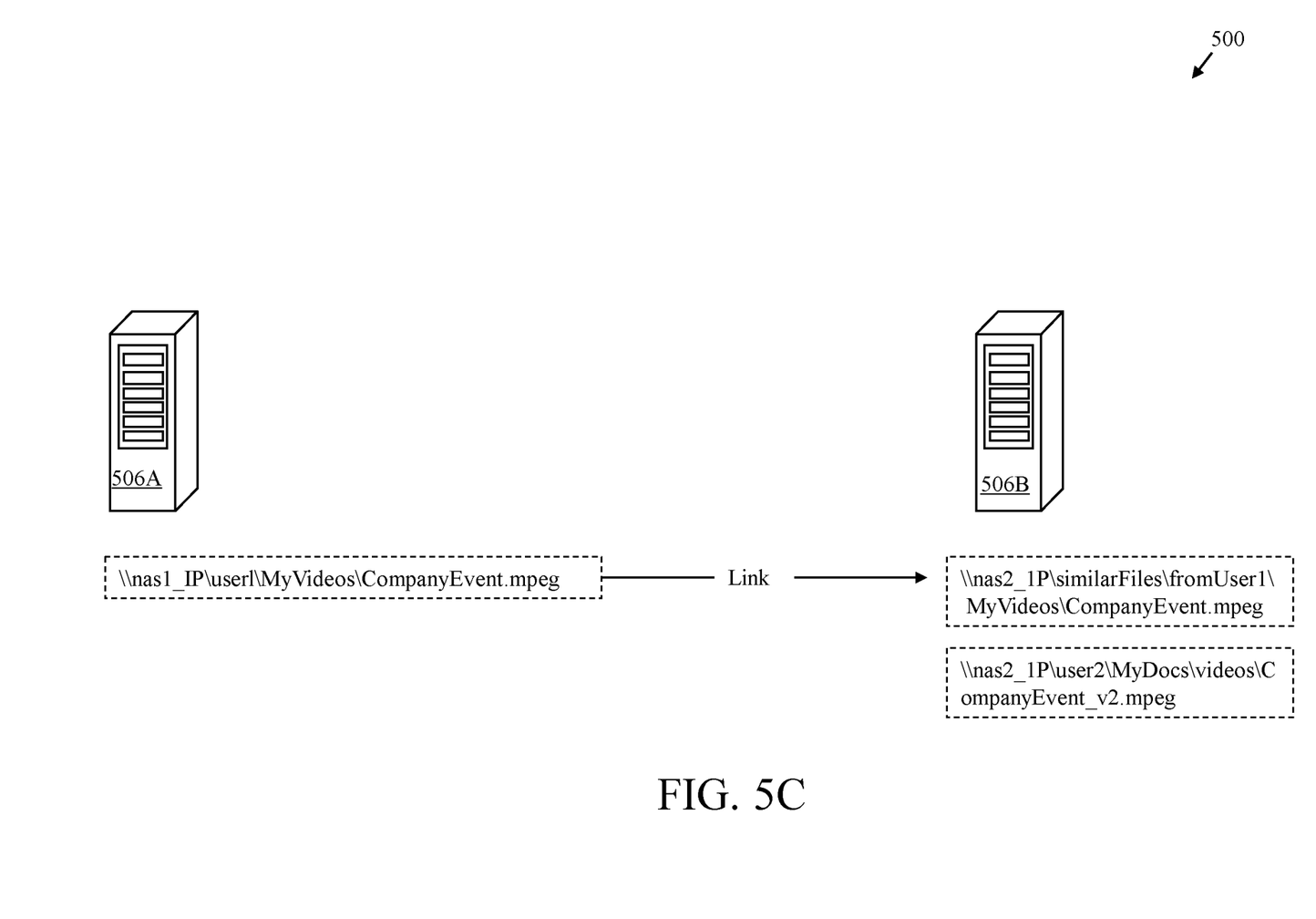

Now, referring to FIG. 5C, at the first network attached server 506A (i.e., NAS1), the link of the movie file "CompanyEvent.mpeg" of the first user 502A is changed from "\\nas1_IP\user1\MyVideos\CompanyEvent.mpeg" to "\\nas2_IP\similarFiles\fromUser1\MyVideos\CompanyEvent.mpeg" as the movie file "CompanyEvent.mpeg" is replaced with the stub (i.e., the link to the new location in the second network attached server 506B).

Figure 5D:
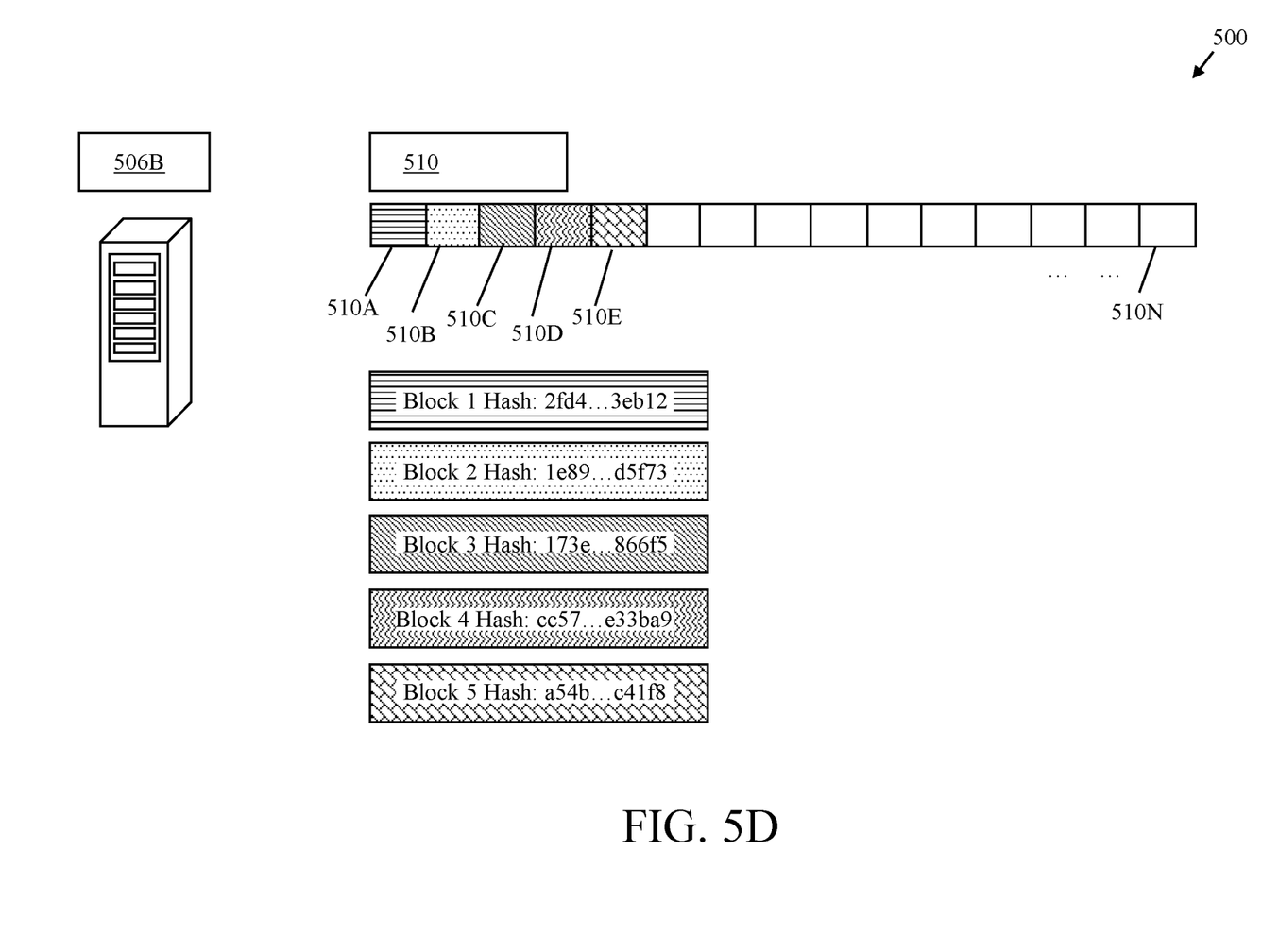

After copying the movie file "CompanyEvent.mpeg" of the first user 502A to the second network attached server 506B (i.e., NAS2) of the second user 502B, both files (i.e., the movie file "CompanyEvent.mpeg" and the new movie file "CompanyEvent_v2.mpeg") are located at the same location (or same storage pool) so that the both files are easily de-duped, described in detail, for example, in FIG. 5D.

Referring to FIG. 5D, after de-duplication, both the files (i.e., the movie file "CompanyEvent.mpeg" and the new movie file "CompanyEvent_v2.mpeg") are stored on five blocks of the second network attached server 506B (i.e., NAS2). The five blocks are the first block 510A, the second block 510B, the third block 510C, the fourth block 510D and the fifth block 510E. Each of the first block 510A, the second block 510B, the third block 510C, the fourth block 510D and the fifth block 510E has different data and different hash values. For example, hash values associated with the first block 510A, the second block 510B, the third block 510C, the fourth block 510D and the fifth block 510E are "Block1 Hash: 2fd4 . . . 3eb12", "Block2 Hash: 1e89 . . . d5f73", "Block3 Hash: 173e . . . 866f5", "Block4 Hash: cc57 . . . e33ba9", and "Block5 Hash: a54b . . . c41f8", respectively. Before, de-duplication, both the files (i.e., the movie file "CompanyEvent.mpeg" and the new movie file "CompanyEvent_v2.mpeg") were stored on two different network attached servers, 506A and 506B and total number of blocks were 7.

In a case, if the movie file "CompanyEvent.mpeg" and the new movie file "CompanyEvent_v2.mpeg" are identical, then, in such a case, the data management device 202 would not copy the file. In another case, if the movie file "CompanyEvent.mpeg" and the new movie file "CompanyEvent_v2.mpeg" are not identical, then, in such a case, the data management device 202 is configured to copy a smaller file (i.e., the "CompanyEvent.mpeg") from the first network attached server 506A (i.e., NAS1) to a bigger file (i.e., the "CompanyEvent_v2.mpeg") stored on the second network attached server 506B (i.e., NAS2). In a yet another case, the data management device 202 may be configured to copy both of the files to a centralised network attached server (e.g., a 3$^{rd}$ NAS) depending on an application scenario.

Optionally, the data management device 202 may be configured to manage a matrix of communication (upload and download) between various NAS servers and decide for each list of similar files to which NAS to migrate them and to obtain the best communication. In the matrix of communication, one or more files from the list of similar files may stay in its current location and would not need to be replaced by the stub. Using the matrix of communication, the data management device 202 may locate the files where exist data transport acceleration like NVMe over Fabrics, also known as NVMe-oF or non-volatile memory express over fabrics. NVMe-oF may be defined as a protocol which is designed to provide data transfer between a host computer and a storage device or system over a network fabric.

In this implementation scenario 500, the first user 502A and the second user 502B and the two similar files are considered, however, there may be a plurality of users using a plurality of NAS servers and a plurality of similar files. By using the data management device 202, the storage space (i.e., the storage space related to an enterprise or a subset of the enterprise or an organisation) can be efficiently used.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural. The word "exemplary" is used herein to mean "serving as an example, instance or illustration". Any embodiment described as "exemplary" is not necessarily to be construed as preferred or advantageous over other embodiments and/or to exclude the incorporation of features from other embodiments. The word "optionally" is used herein to mean "is provided in some embodiments and not provided in other embodiments". It is appreciated that certain features of the present disclosure, which are, for clarity, described in the context of separate embodiments, may also be provided in combination in a single embodiment. Conversely, various features of the present disclosure, which are, for brevity, described in the context of a single embodiment, may also be provided separately or in any suitable combination or as suitable in any other described embodiment of the disclosure.

What is claimed is:

1. A computer-implemented method of data management in a data storage system comprising a plurality of data storage units, the method comprising:

dividing each file in the data storage system into a plurality of blocks having a common size;

generating a hash value for each block using a common hash algorithm;

identifying a plurality of similar files in different data storage units, based on a comparison of the hash value for each block for each file;

moving one or more of the identified similar files including selecting the data storage unit of one file as an optimal storage location, and moving one or more other similar files to the optimal storage location, such that similar files are stored in a single data storage unit; and wherein the optimal storage location is selected based on one of an access speed or reliability of the data storage units and based on a protection level of a sensitive data;

for one or more of the moved files, generating a link to a new location of the file; and de-duplicating the files in the data storage system based on the hash values, wherein identifying the plurality of similar files includes collecting a predefined number of hash values from each file having a minimum file size, wherein the collected hash values are the highest of each file.

2. The method of claim 1, wherein collecting hash values from each file in the data storage system includes filtering the hash values according to one of a minimum file size, or file type.

3. The method of claim 1, wherein identifying the plurality of similar files includes determining a percentage number of blocks in common and comparing the determined percentage to a minimum threshold value.

4. The method of claim 1, wherein moving the identified similar files comprises moving the identified similar files to a centralised data storage unit.

5. The method of claim 1, wherein the optimal storage location is selected to minimise the volume of data to be copied.

6. The method of claim 1, wherein the data storage system is a network- based system.

7. A non-transitory computer-readable medium configured to store instructions for data management in a data storage system comprising a plurality of data storage units, which, when executed by a processor, cause the processor to perform steps comprising:

dividing each file in the data storage system into a plurality of blocks having a common size;

generating a hash value for each block using a common hash algorithm;

identifying a plurality of similar files in different data storage units, based on a comparison of the hash value for each block for each file;

moving one or more of the identified similar files, including selecting the data storage unit of one file as an optimal storage location, and moving one or more other similar files to the optimal storage location, such that similar files are stored in a single data storage unit; and wherein the optimal storage location is selected based on one of an access speed or reliability of the data storage units and based on a protection level of a sensitive data;

for one or more of the moved files, generating a link to a new location of the file; and de-duplicating the files in the data storage system based on the hash values, wherein identifying the plurality of similar files includes collecting a predefined number of hash values from each file having a minimum file size, wherein the collected hash values are the highest of each file.

8. A data management device for a data storage system comprising a plurality of data storage units, the data management device configured to:

divide each file in the data storage system into a plurality of blocks having a common size;

generate a hash value for each block using a common hash algorithm;

identify a plurality of similar files in different data storages, based on a comparison of the hash value for each block for each file;

move one or more of the identified similar files, including selecting the data storage unit of one file as an optimal storage location, and moving one or more other similar files to the optimal storage location, such that similar files are stored in a single data storage; and wherein the optimal storage location is selected based on one of an access speed or reliability of the data storage units and based on a protection level of a sensitive data;

for one or more of the moved files, generate a link to a new location of file; and de-duplicating the files in the data storage system based on the hash values, wherein identifying the plurality of similar files includes collecting a predefined number of hash values from each file having a minimum file size, wherein the collected hash values are the highest of each file.

9. The device of claim 8, wherein collecting hash values from each file in the data storage system includes filtering the hash values according to one of a minimum file size, or file type.

10. The device of claim 8, wherein identifying the plurality of similar files includes determining a percentage number of blocks in common and comparing the determined percentage to a minimum threshold value.

11. The device of claim 8, wherein moving the identified similar files comprises moving the identified similar files to a centralised data storage.

* * * * *